(12) United States Patent
Jung

(10) Patent No.: US 7,625,797 B2
(45) Date of Patent: Dec. 1, 2009

(54) EMBEDDED NV MEMORY AND METHOD OF MANUFACTURING THE SAME

(75) Inventor: Jin Hyo Jung, Boocheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/848,670

(22) Filed: Aug. 31, 2007

(65) Prior Publication Data

US 2008/0054335 A1    Mar. 6, 2008

(30) Foreign Application Priority Data

Aug. 31, 2006    (KR) .................. 10-2006-0083859

(51) Int. Cl.
*H01L 21/336*    (2006.01)

(52) U.S. Cl. ................. 438/257; 257/315; 257/E21.68; 438/264

(58) Field of Classification Search .............. 257/E29.3, 257/315, E21.68; 438/257, 264
See application file for complete search history.

(56) References Cited

U.S. PATENT DOCUMENTS 5,861,347 A * 1/1999 Maiti et al. ................. 438/787
7,366,026 B2 * 4/2008 Lee ......................... 365/185.29
2001/0052611 A1 * 12/2001 Kim ........................... 257/296
2004/0119112 A1 * 6/2004 Lojek ......................... 257/316

\* cited by examiner

*Primary Examiner*—David Vu
*Assistant Examiner*—Brandon Fox
(74) *Attorney, Agent, or Firm*—Saliwanchik, Lloyd & Saliwanchik

(57) ABSTRACT

Disclosed in a non-volatile (NV) memory device and a method of manufacturing the same. The method includes forming transistor and EEPROM regions by implanting first and second conductive impurity ions into a semiconductor substrate, depositing a gate oxide on an entire surface of the semiconductor substrate, forming a first gate poly on the EEPROM region, removing the gate oxide not below the first gate poly, forming a logic gate oxide, a tunnel oxide and a coupling oxide, forming a logic gate poly on the transistor region and a second gate poly on a sidewall of the first gate poly, forming source/drain extension regions by implanting first and second conductive impurity ions, forming a sidewall spacer on the logic gate poly and the second gate poly, and forming a silicide on the source, drain and logic gate poly of the transistor region.

10 Claims, 6 Drawing Sheets

EMBEDDED NV MEMORY AND METHOD OF MANUFACTURING THE SAME

CROSS-REFERENCE TO RELATED APPLICATION

The present application claims the benefit under 35 U.S.C. §119 of Korean Patent Application No. 10-2006-0083859, filed Aug. 31, 2006, which is hereby incorporated by reference in its entirety.

BACKGROUND

An embedded NV (non-volatile) memory is formed by integrating an NV memory device and a logic circuit for driving the NV memory device on a single chip, and is manufactured through a combination of basic logic and NV memory technologies.

Various types of embedded NV memories exist, and a proper embedded NV memory is used according to purposes thereof.

An embedded NV memory includes a single poly EEPROM (electrically erasable programmable read-only memory), in which a polycrystal silicon layer functioning as a gate is a single layer, a stack gate (ETOX), in which two polycrystal silicon layers are vertically stacked, a dual poly EEPROM which is an intermediate type between the single poly EEPROM and the stack gate, and a split gate.

The stack gate is suitable for a high density and high performance memory device and is not suitable for a low density memory device because it has the smallest cell size and a complicated circuit. The EEPROM is mainly used for a low density memory device. For example, the single poly EEPROM can be manufactured by simply adding two mask processes in a logic procedure, but it is not suitable for a high density memory device because it has a cell size greater than the stack gate by about 200 times.

The dual poly EEPROM, which is an intermediate type between the single poly EEPROM and the stack gate, and the split gate are disadvantageous in that their manufacturing process is complicated.

BRIEF SUMMARY

An embodiment of the present invention provides an embedded non-volatile (NV) memory, which has small cell size and a simple manufacturing process, and a method of manufacturing the same.

In one embodiment, there is provided a method of manufacturing an embedded NV memory, the method including: forming transistor and EEPROM regions by implanting first and second conductive impurity ions into a semiconductor substrate; depositing a gate oxide and polysilicon on an entire surface of the semiconductor substrate; forming a first gate poly on the EEPROM region through patterning and etching processes; removing the gate oxide not below the first gate poly; forming a logic gate oxide, a tunnel oxide and a coupling oxide; depositing a second polysilicon layer; forming a logic gate poly on the transistor region, and a second gate poly on a sidewall of the first gate poly through an etching process of the second polysilicon layer; forming source/drain extension regions by implanting first and second conductive impurity ions into the substrate; forming a sidewall spacer; forming a source and drain in the transistor region using the sidewall spacer as a mask; and forming a silicide on the source, drain and logic gate poly.

In another embodiment, there is provided an embedded NV memory including: CMOS (complementary metal oxide semiconductor) and EEPROM well regions on a semiconductor substrate; a gate oxide and a first gate poly on the EEPROM well region; a logic gate oxide on the CMOS well region, and a tunnel oxide and a coupling oxide on the EEPROM well region; a logic gate poly on the CMOS well region; a second gate poly on a sidewall of the first gate poly with the coupling oxide therebetween; and a sidewall spacer on the logic gate poly and a sidewall of the second gate poly.

In another embodiment, there is provided an embedded NV memory including: a transistor and an EEPROM. The EEPROM can include a first conductive well in a semiconductor substrate; source/drain regions in the first conductive well; a gate oxide and a first gate poly on the first conductive well; a tunnel oxide and a coupling oxide on the source/drain regions and the first gate poly, respectively; a second gate poly on a sidewall of the first gate poly with the coupling oxide therebetween; and a sidewall spacer on a sidewall of the second gate poly.

DETAILED DESCRIPTION

Hereinafter, an embedded NV memory and a method of manufacturing the same according to embodiments of the present invention will be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
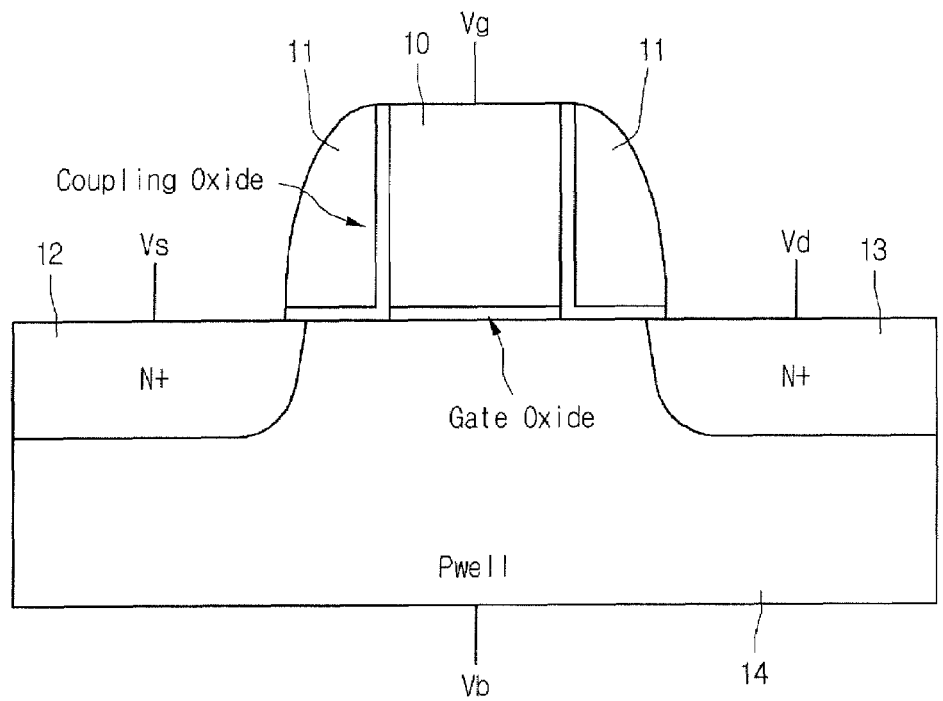
FIGS. 1 and 2 are cross-sectional views showing a vertical structure of a NV memory according to an embodiment of the present invention.
Figure 2:
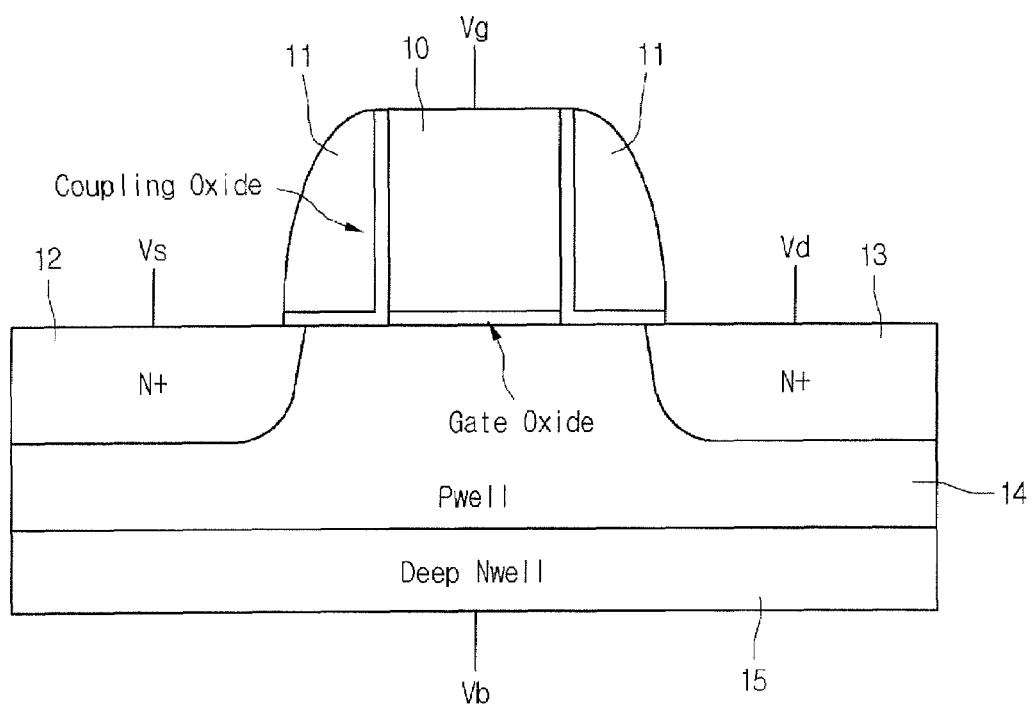
Figure 3:
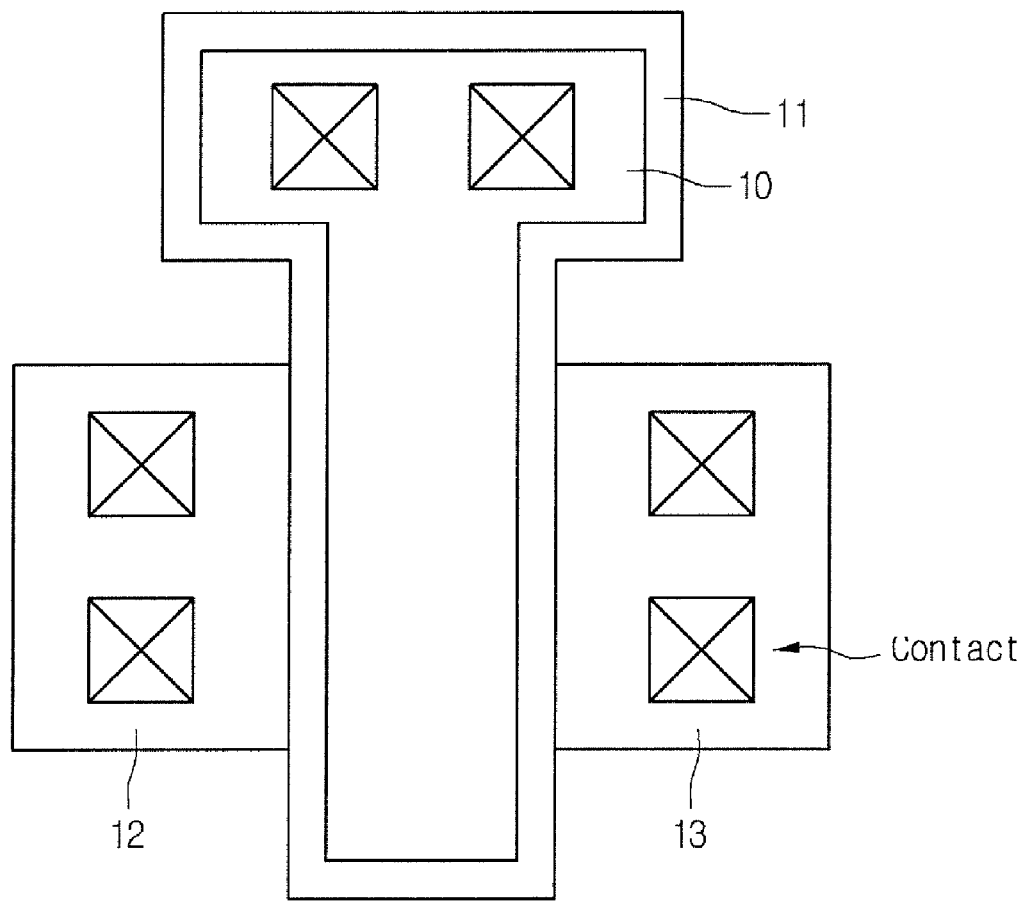
FIG. 3 is a view showing a layout of a NV memory according to an embodiment of the present invention.

FIGS. 1 and 2 are views showing a vertical structure of a NV memory according to an embodiment, and FIG. 3 is a view showing a layout of the NV memory according to an embodiment.

Referring to FIGS. 1 and 2, a first gate poly 10 serves as a control gate and a select gate.

A second gate poly 11 operates similarly to a floating gate in the related floating gate EEPROM, and controls source and drain regions 12 and 13.

In the embodiment as shown in FIG. 2, a triple well structure is provided, in which a P-well 14 is surrounded by a deep N-well 15 in order to enhance the isolation of the P-well 14.

FIG. 3 is a view showing the layout of the NV memory according to an embodiment.

Referring to FIG. 3, the layout of the NV memory according to an embodiment can be similar to that of a MOS transistor, but the first gate poly 10 is surrounded by the second gate poly 11 which is different from the layout of the MOS transistor in which a gate poly is surrounded by a sidewall spacer.

Further, N-type impurities are not implanted below the second gate poly 11 in order to form an LDD region.

Thus, the method for manufacturing the NV memory of the embodiment can adopt most of a related CMOS device manufacturing processes, while replacing the sidewall spacer formation process with the second gate poly formation process.

That is, instead of performing a sidewall spacer formation process, the poly is deposited and an etchback process is performed such that the sidewall of the first gate poly 10 is surrounded by the second gate poly 11.

Accordingly, the NV memory can be manufactured through a very simple process as compared with the related floating gate EEPROM. Further, since the NV memory can have a general MOS transistor structure, the unit cell area thereof is very small.

Accordingly, the NV memory structure of the above described embodiments can be used to manufacture a high density EEPROM at a very low cost.

Next, bias conditions for the operation of the NV memory structure according to one embodiment are as follows.

[Program Method]

F/N Tunneling scheme: Vg=+Vp1, Vd=Vs=GND, Vb=Floating or GND

Hot Electron Injection scheme: Vg=+Vp2, Vd=+Vd1, Vs=Vb=GND

[Erase Method]

F/N Tunneling scheme 1: Vg=−Ve1, Vd=Vs=GND, Vb=Floating or GND

F/N Tunneling scheme 2: Vg=GND, Vd=Vs=−Ve1, Vb=Floating or GND

[Reading Method]

Vg=+Vref, Vd=+Vd2, Vs=Vb=GND

According to the program method as described above, electrons are injected to the second gate poly 11 through one of the F/N Tunneling and Hot Electron Injection schemes. According to the erase method, the electrons are extracted from the second gate poly 11 through the F/N Tunneling scheme.

Reference voltage +$V_{ref}$ is applied to the first gate poly 10 in order to read a program or erase state, and proper positive voltage is applied to the drain 13.

In the case of the program state in which electrons have been injected to the second gate poly 11, threshold voltage at a portion corresponding to the source/drain extension region under the second gate poly 11 is greatly increased.

Accordingly, although the reference voltage is applied to the first gate poly 10, the source/drain extension region under the second gate poly 11 is not inverted because the threshold voltage of the second gate poly 11 is much higher than the reference voltage, so that electric current does not flow and thus the program state is sensed.

However, in the case of the erase state in which electrons have been extracted from the second gate poly 11, the threshold voltage at the portion corresponding to the source/drain extension region under the second gate poly 11 is decreased.

Accordingly, as the reference voltage is applied to the first gate poly 10, the source/drain extension region under the second gate poly 11 is inverted because the threshold voltage of the second gate poly 11 is lower than the reference voltage, so that electric current flows from the drain 13 to the source 12 and thus the erase state is sensed.

Voltage coupled to the second gate poly 11 is determined by the ratio (i.e. coupling ratio) of capacitance between the second gate poly 11 and the source/drain region to capacitance between the first gate poly 10 and the second gate poly 11. According to an embodiment, since the capacitance between the source/drain region and the second gate poly 11 is much smaller than the capacitance between the second gate poly 11 and the first gate poly 10, the coupling ratio can have a value of more than 0.8.

A method for manufacturing the NV memory of an embodiment adopts a related CMOS device manufacturing process where the sidewall spacer formation process of the CMOS device manufacturing process is replaced with a second gate poly formation process. Accordingly, the NV memory can be manufactured through a very simple process as compared with the related floating gate EEPROM.

Further, since the NV memory of an embodiment has a general MOS transistor structure, the unit cell area thereof is very small similarly to the related floating gate EEPROM.

Furthermore, when the NV memory structure of the above described embodiment is used, the high density EEPROM can be manufactured at a very low cost.

Moreover, since the NV memory can have a high coupling ratio, most of the voltage applied to the first gate poly is induced to the second gate poly, and thus the voltage efficiency can be improved.

In addition, since the NV memory can adopt the related CMOS device manufacturing processes, it can be easily embedded into a logic device.

Figure 4:
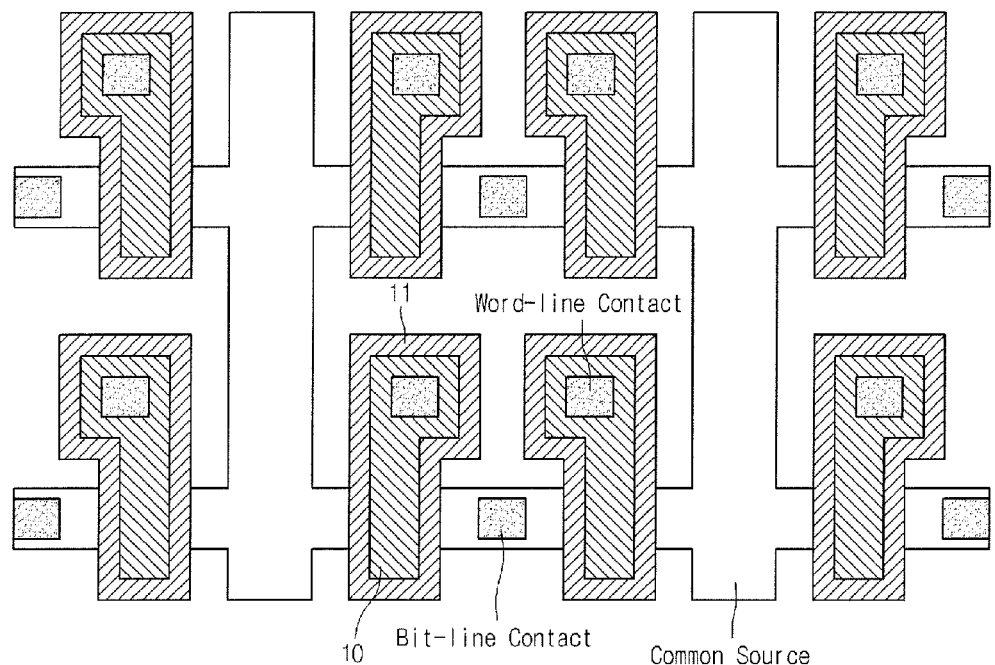
FIG. 4 is a view showing a cell array of a NV memory according to an embodiment of the present invention.

FIG. 4 is a view showing a cell array of the NV memory according to an embodiment of the present invention.

As shown in FIG. 4, the NV memory has a structure in which the periphery of the first gate poly 10 is completely surrounded by the second gate poly 11.

Accordingly, the coupling ratio can be significantly increased as compared with the related floating gate device structure.

Moreover, different from the related floating gate device, since the second gate poly 11 does not need to be separately defined in the word line and bit line directions, the NV memory can be manufactured through a very simple process.

FIGS. 5 to 11 are cross-sectional views sequentially showing a procedure of manufacturing the embedded NV memory according to a first embodiment.

Figure 5:
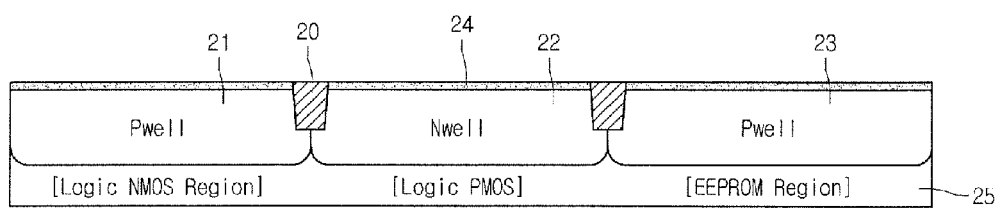
FIGS. 5 to 11 are cross-sectional views sequentially showing a procedure of manufacturing an embedded NV memory according to a first embodiment of the present invention.

Referring to FIG. 5, active regions of a semiconductor substrate can be isolated by shallow trench isolation regions (STIs) 20. A P well 21 can be formed in active regions for a logic NMOS, an N well 22 can be formed in active regions for a logic PMOS, and a P well 23 can be formed in active regions for an EEPROM. A pad oxide 24 can be formed on the substrate 25 before forming the P well 21, N well 22, and P well 23.

Figure 6:
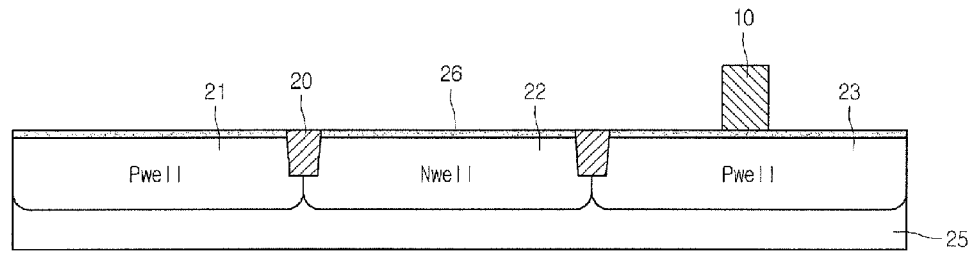

Referring to FIG. 6, the pad oxide 24 can be removed, and a gate oxide 26 can be grown on the entire surface of the semiconductor substrate 25. Polysilicon can be deposited on the entire surface of the semiconductor substrate 25, and the first gate poly 10 can be formed through patterning/etching processes.

Figure 7:
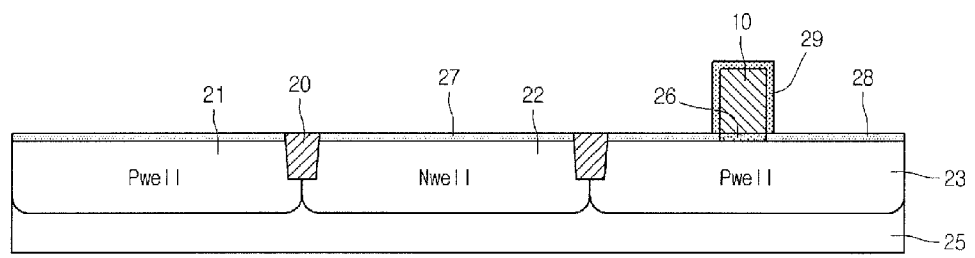

Referring to FIG. 7, the gate oxide 26 that is not below the first gate poly 10 can be removed from the substrate and a logic gate oxide 27 can be grown.

In one embodiment, during the process of growing the logic gate oxide 27, a tunnel oxide 28 and a coupling oxide 29 can be simultaneously formed on the EEPROM region.

According to another embodiment, the tunnel oxide 28 and the coupling oxide 29 can be formed first and then the logic gate oxide 27 can be formed.

In yet another embodiment, the logic gate oxide 27 can be formed first and then the tunnel oxide 28 and the coupling oxide 29 can be grown.

Figure 8:
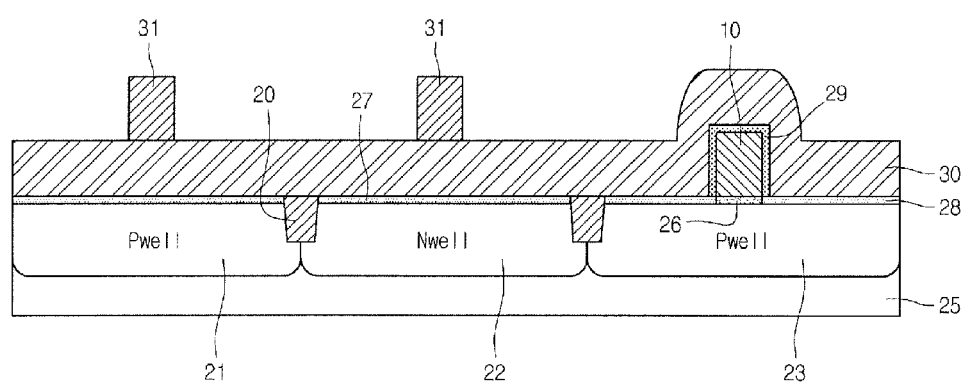

Referring to FIG. 8, a second polysilicon layer 30 can be deposited on the entire surface of the semiconductor substrate 25. A photoresist pattern 31 for a logic gate poly can be formed through a patterning process. That is, the photoresist pattern 31 is not formed in the EEPROM region, but is formed in the logic PMOS and logic NMOS regions.

Figure 9:
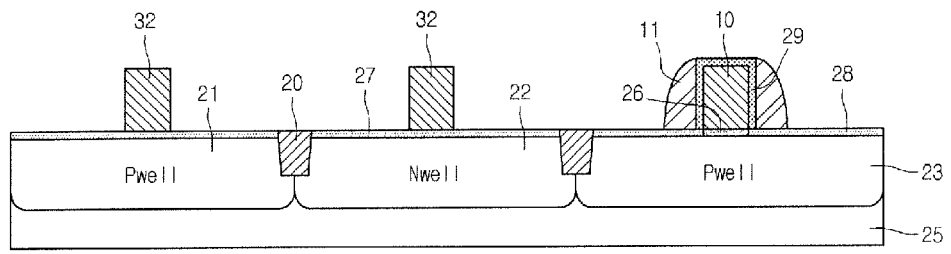

Referring to FIG. 9, a logic gate poly 32 is formed through an etching process using the photoresist pattern 31 as an etch mask. During the etching process for the logic gate poly 32, a second gate poly 11 is fabricated around the first gate poly 10 in the form of a sidewall spacer.

Figure 10:
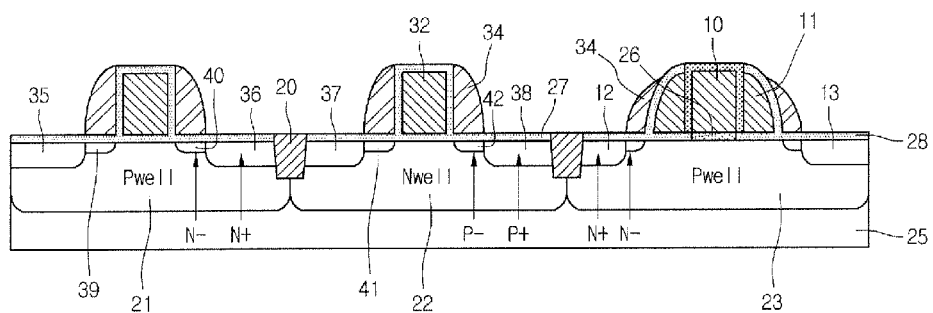

Referring to FIG. 10, source/drain extension regions 39, 40, 41, and 42 are formed through an impurity implantation process. Then, a sidewall spacer 34 can be formed. Next, source/drain regions 35, 36, 37, 38, 12, and 13 can be formed through an impurity implantation process. The implantation process for P-type and N-type impurities can be separately performed.

The source/drain regions 12 and 13 in the EEPROM region can be formed through an N-type impurity implantation process. However, other embodiments can provide an EEPROM region in PMOS form.

According to an embodiment, since the impurity ions are implanted after forming the second gate poly 11, the impurity ions are not directly implanted into the substrate below the second gate poly 11.

Figure 11:
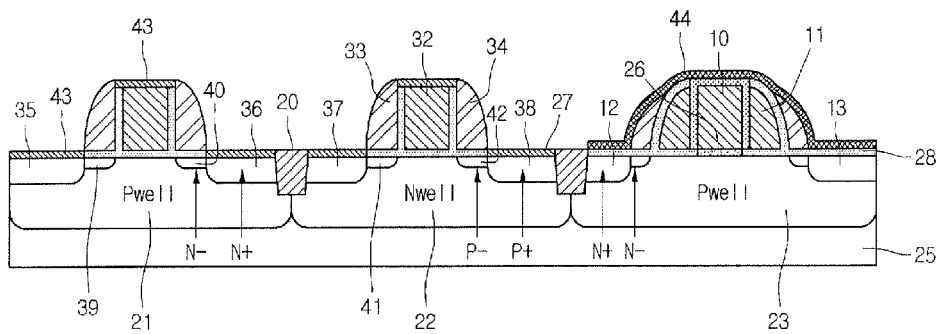

Referring to FIG. 11, a silicide 43 can be formed on the sources 35 and 37, drains 36 and 38, and gate 32 of the CMOS devices. A silicide blocking layer 44 can be formed on the EEPROM region, so that the silicide is prevented from being formed on the source 12, drain 13, first gate poly 10 and second gate poly 11 of the EEPROM device when silicide is being formed in the logic regions.

According to another embodiment, the silicide blocking layer 44 can be formed only on the first gate poly 10 and the second gate poly 11, so that the silicide can be formed on the source 12 and the drain 13 of the EEPROM region.

Figure 12:
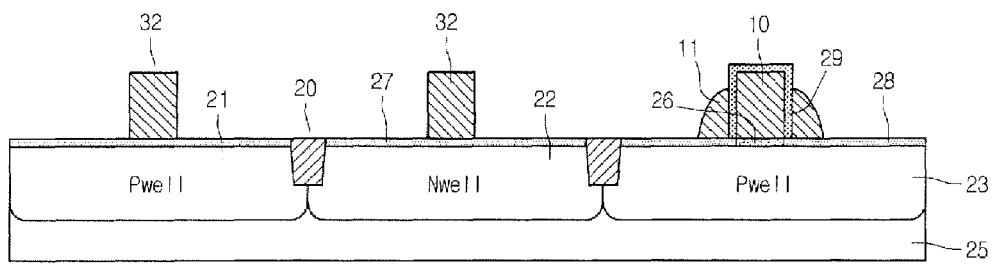
FIGS. 12 and 13 are cross-sectional views sequentially showing a procedure of forming a suicide according to another embodiment of the present invention.
Figure 13:
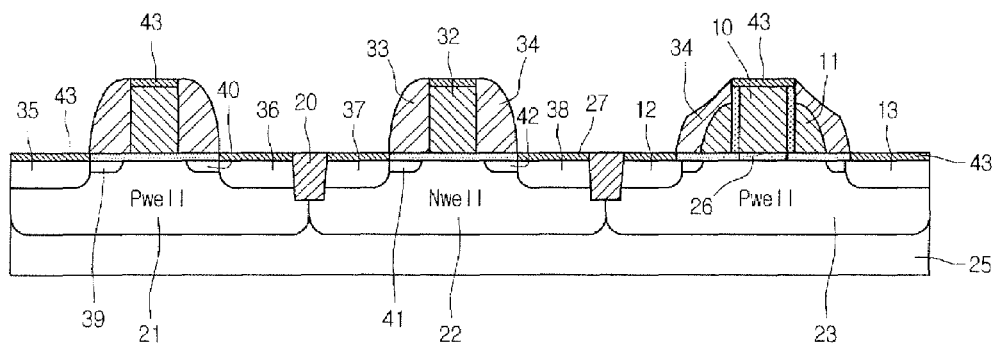

FIGS. 12 and 13 are cross-sectional views of a method of manufacturing a NV memory device according to another embodiment.

Referring to FIGS. 12 and 13, an etching process of forming the logic gate poly 32 can be performed such that the second gate poly 11 in the form of a sidewall can have a height lower than the top surface of the first gate poly 10.

Then, the sidewall spacer 34 can be formed on the second gate poly 11 covering the second gate poly 11.

Here, a silicide blocking layer is not formed on the EEPROM region, so that the silicide is formed on the first gate poly 10, source 12 and drain 13 of the EEPROM device as well as the logic NMOS and PMOS devices.

According to embodiments of the present invention, the embedded NV memory can be achieved by adding only one photo patterning process to the related CMOS device manufacturing process, so that the entire procedure can be simply implemented as compared with the related floating gate embedded EEPROM, lowering the manufacturing cost and significantly shortening the process development period.

Further, according to an embodiment, the unit cell area can be greatly reduced to a level corresponding to that of the related floating gate embedded EEPROM cell, so that a high density EEPROM can be achieved with a low manufacturing cost. Accordingly, the embodiment is suitable for embedding a MTP (Multi-Time Program) or OTP (One-Time Program) EEPROM of less than 1 Mb into the related back-bone standard logic process.

Furthermore, according to an embodiment, the first gate poly is completely surrounded by the second gate poly, so that the coupling ratio can be significantly increased, thereby improving the efficiency of voltage applied during the program/erase operation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an embedded non-volatile (NV) memory, comprising:
    forming transistor and EEPROM (electrically erasable programmable read-only memory) regions in a semiconductor substrate;
    depositing a gate oxide on an entire surface of the semiconductor substrate, depositing a first polysilicon layer on the EEPROM region, and forming a first gate poly through patterning and etching processes;
    removing the gate oxide from regions not below the first gate poly;
    forming a logic gate oxide, a tunnel oxide and a coupling oxide;
    depositing a second polysilicon layer and forming a logic gate poly on the transistor region, and a second gate poly on sidewalls of the first gate poly through an etching process, wherein depositing the second polysilicon layer and forming the logic gate poly on the transistor region and the second gate poly on sidewalls of the first gate through the etching process comprises;
        depositing the second polysilicon layer on the semiconductor substrate including the logic gate oxide, the tunnel oxide, and the coupling oxide,
        forming a photoresist pattern on the second polysilicon layer, wherein the photoresist pattern does not cover the first gate poly, and
        etching the second polysilicon layer using the patterned photoresist as an etch mask, whereby the logic gate poly is formed on the transistor region and the second gate poly is formed on the sidewalls of the first gate poly;
    forming source/drain extension regions;
    forming sidewall spacer on sidewalls of the logic gate poly and the second gate poly;

forming source and drain regions; and forming a silicide on exposed source and drain regions and the logic gate poly.

2. The method according to claim 1, wherein the transistor region comprises logic NMOS and PMOS regions.

3. The method according to claim 1, wherein the logic gate oxide is formed after forming the tunnel oxide and the coupling oxide.

4. The method according to claim 1, wherein the tunnel oxide and the coupling oxide are formed after forming the logic gate oxide.

5. The method according to claim 1, wherein the tunnel oxide, the coupling oxide and the logic gate oxide are simultaneously formed.

6. The method according to claim 1, wherein the second gate poly is formed on sidewalls of the first gate poly in a form of a sidewall spacer.

7. The method according to claim 1, further comprising forming a suicide blocking layer on the EPPROM region before forming a silicide on the exposed source and drain regions and the logic gate poly.

8. The method according to claim 1, further comprising forming a suicide blocking layer on the first gate poly and the second gate poly of the EEPROM region before forming a silicide on the exposed source and drain regions and the logic gate poly.

9. The method according to claim 1, wherein the second gate poly has a height lower than a height of the first gate poly; and wherein the sidewall spacer completely covers the second gate poly.

10. The method according to claim 9, further comprising forming a silicide on the first gate poly.

* * * * *